(12) United States Patent
Wang et al.

(10) Patent No.: US 12,283,547 B2
(45) Date of Patent: Apr. 22, 2025

(54) CONTACT STRUCTURES FOR THREE-DIMENSIONAL MEMORY DEVICES AND METHODS FOR FORMING THE SAME

(71) Applicant: Yangtze Memory Technologies Co., Ltd., Hubei (CN)

(72) Inventors: Di Wang, Hubei (CN); Zhong Zhang, Hubei (CN); Wenxi Zhou, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 401 days.

(21) Appl. No.: 17/655,256

(22) Filed: Mar. 17, 2022

(65) Prior Publication Data
US 2022/0270972 A1    Aug. 25, 2022

Related U.S. Application Data

(63) Continuation of application No. PCT/CN2021/118434, filed on Sep. 15, 2021.

(30) Foreign Application Priority Data

Feb. 22, 2021    (CN) .......................... 202110196112.9

(51) Int. Cl.
*H01L 23/535*    (2006.01)
*H01L 21/768*    (2006.01)
(Continued)

(52) U.S. Cl.
CPC ...... *H01L 23/535* (2013.01); *H01L 21/76805* (2013.01); *H01L 21/76895* (2013.01);
(Continued)

(58) Field of Classification Search
CPC ......... H01L 21/76805; H01L 21/76895; H01L 24/08; H01L 24/80; H01L 25/0657;
(Continued)

(56) References Cited

U.S. PATENT DOCUMENTS 9,202,707 B2    12/2015    Kawamata et al.
10,325,847 B2    6/2019    Freeman et al.
(Continued)

FOREIGN PATENT DOCUMENTS

CN    103563070 A    2/2014
CN    104081502 A    10/2014
(Continued)

OTHER PUBLICATIONS

IInternational Search Report of the International Searching Authority directed to related International Patent Application No. PCT/CN2021/118434, mailed Dec. 16, 2021; 4 pages.

*Primary Examiner* — Thanh Y. Tran
(74) *Attorney, Agent, or Firm* — Hanley, Flight & Zimmerman, LLC

(57) ABSTRACT

The present disclosure describes a three-dimensional (3D) memory device includes first and second memory arrays disposed on a semiconductor layer. The 3D memory device can also include a staircase structure disposed between the first and second memory arrays. The staircase structure includes first and second staircase regions. The first staircase region includes a first staircase structure that contains a first plurality of stairs descending in a first direction. The second staircase region includes a second staircase structure that contains a second plurality of stairs descending in a second direction. The 3D memory device can also include a contact region disposed between the first and second staircase regions. The contact region includes a plurality of contacts the extending through an insulating layer and into the semiconductor layer.

20 Claims, 12 Drawing Sheets

(51) Int. Cl.
*H01L 23/00* (2006.01)
*H01L 25/00* (2006.01)
*H01L 25/065* (2023.01)
*H01L 25/18* (2023.01)

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ........... H01L 25/18; H01L 2224/08145; H01L 2224/80895; H01L 2924/1431; H01L 2924/14511; H01L 2225/06541; H01L 23/535
See application file for complete search history.

(56) References Cited

U.S. PATENT DOCUMENTS

| | | | |
|---|---|---|---|
| 10,847,534 B2 | 11/2020 | Chu | |
| 11,758,732 B2 | 9/2023 | Lu et al. | |
| 2015/0279852 A1 | 10/2015 | Mizutani et al. | |
| 2019/0280001 A1 | 9/2019 | Terasawa et al. | |
| 2021/0296334 A1 | 9/2021 | Zhang et al. | |
| 2021/0296335 A1 | 9/2021 | Sun et al. | |
| 2021/0320119 A1 | 10/2021 | Zhang et al. | |
| 2021/0320122 A1 | 10/2021 | Zhang et al. | |
| 2021/0358945 A1 | 11/2021 | Zhang et al. | |
| 2021/0375806 A1 | 12/2021 | Zhang | |
| 2022/0084957 A1* | 3/2022 | Nanami | H10B 41/27 |
| 2022/0085048 A1* | 3/2022 | Lee | H10B 43/40 |
| 2022/0139950 A1* | 5/2022 | Guo | H10B 41/27 257/314 |
| 2022/0189875 A1* | 6/2022 | Sung | H10B 43/10 |

FOREIGN PATENT DOCUMENTS

| | | |
|---|---|---|
| CN | 108573860 A | 9/2018 |
| CN | 109314114 A | 2/2019 |
| CN | 110021607 A | 7/2019 |
| CN | 111223867 A | 6/2020 |
| CN | 111492480 A | 8/2020 |
| CN | 111566813 A | 8/2020 |
| CN | 111758161 A | 10/2020 |
| CN | 111758162 A | 10/2020 |
| CN | 111758164 A | 10/2020 |
| CN | 112041986 A | 12/2020 |
| CN | 112071850 A | 12/2020 |
| CN | 112185981 A | 1/2021 |
| CN | 112272868 A | 1/2021 |
| CN | 112352315 A | 2/2021 |
| CN | 112951802 A | 6/2021 |

\* cited by examiner

CONTACT STRUCTURES FOR THREE-DIMENSIONAL MEMORY DEVICES AND METHODS FOR FORMING THE SAME

CROSS-REFERENCE TO RELATED APPLICATIONS

This application claims priority to PCT Patent Application No. PCT/CN2021/118434 filed on Sep. 15, 2021, which claims priority to Chinese Patent Application No. 202110196112.9 filed on Feb. 22, 2021, all of which are incorporated herein by reference in their entireties.

TECHNICAL FIELD

This present disclosure generally relates to the field of semiconductor technology, and more particularly, to a method for forming a three-dimensional (3D) memory device.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques have become challenging and costly. As such, memory density for planar memory cells approaches an upper limit. A three-dimensional (3D) memory architecture can address the density limitation in planar memory cells.

BRIEF SUMMARY

Embodiments of a three-dimensional (3D) capacitor structure for a memory device and methods for forming the same are described in the present disclosure.

In some embodiments, a three-dimensional (3D) memory device can include first and second memory arrays disposed on a semiconductor layer. The 3D memory device can also include a staircase structure disposed between the first and second memory arrays. The staircase structure can include first and second staircase regions. The first staircase region can include a first staircase structure that contains a first plurality of stairs descending in a first direction. The second staircase region can include a second staircase structure that contains a second plurality of stairs descending in a second direction. The 3D memory device can also include a contact region disposed between the first and second staircase regions. The contact region can include a plurality of contacts the extending through an insulating layer and into the semiconductor layer.

In some embodiments, a three-dimensional (3D) memory device can include first and second semiconductor structures. The first semiconductor structure can include first and second memory arrays disposed on a semiconductor layer. The 3D memory device can also include a staircase structure disposed between the first and second memory arrays and including first and second staircase structures. The first staircase structure can include a first plurality of stairs descending in a first direction. The second staircase structure can include a second plurality of stairs descending in a second direction. The 3D memory device can also include a contact region in contact with the first and second staircase structures. The contact region can include a plurality of contacts extending through an insulating layer and into the semiconductor layer. The 3D memory device can also include a first bonding layer on the plurality of contacts. The second semiconductor structure can include a peripheral circuit and a second bonding layer over the peripheral circuit. The second bonding layer is in contact with the first bonding layer.

In some embodiments, a method for forming a three-dimensional (3D) memory device can include disposing an alternating layer stack on a semiconductor layer, wherein the alternating layer stack can include a contact region in contact with first and second staircase regions. The method can also include performing a plurality of etching processes on the alternating layer stack in the first and second staircase regions, wherein each etching process of the plurality of etching process etches a portion of the alternating layer stack in the contact region. The method further can include disposing an isolating dielectric layer in the contact region and on the first and second staircase structures. The method further can include forming a plurality of openings in the isolation dielectric layer disposed in the contact region and disposing conductive materials in the plurality of openings to form a plurality of contacts in the TSC region.

In some embodiments, a 3D memory device can include a memory chip and a peripheral chip. The memory chip can include a first substrate and an alternating layer stack formed on the first substrate. The memory chip can also include first and second memory array structures, staircase structures, and connectors for electrically coupling the staircase structure to the first or second memory array structure. The memory chip can also include through-silicon contacts (TSCs) formed between the first and second memory arrays. The memory chip can also include an interconnect layer formed above the alternating layer stack and a first bonding layer formed above the interconnect layer. The peripheral chip can be formed on the memory chip and bonded to the first bonding layer. The peripheral chip can be electrically coupled to the first substrate through the first bonding layer, the interconnect layer, and the TSCs.

In some embodiments, a staircase structure can include first and second staircase regions formed along a first direction. Staircases formed in the first staircase region is electrically coupled to the first memory array. Staircases formed in the second staircase region is electrically coupled to the second memory array.

In some embodiments, the 3D memory device can also include connectors extending along the first direction. The connectors extend along the first direction and electrically connects the first and second memory arrays. In some embodiments, the connectors can be formed in a connector region that extends in the same direction as the staircase regions. At least one stair of the staircase structures can be electrically connected to the first and second memory arrays through the connectors.

In some embodiments, a first staircase structure in the first staircase region is formed at a different height than a second staircase structure in the second staircase region.

In some embodiments, TSCs are formed between the first and second staircase regions.

In some embodiments, TSCs are formed in a TSC region that extends along the first and second staircase regions.

In some embodiments, the staircase structures include at least a pair of staircases opposing each other in a first direction and each staircase of the pair of staircases can include the same number of stairs.

In some embodiments, the peripheral chip can include a second bonding layer configured to be bonded to the first bonding layer. The peripheral chip can also include peripheral circuitry formed in contact with the second bonding layer and is electrically connected to the first bonding layer through the second bonding layer. The peripheral chip can also include a second substrate in contact with the peripheral circuitry.

In some embodiments, a method for forming a 3D memory device can include forming a memory chip and a peripheral chip. Forming the memory chip can include forming an alternating layer stack on a first substrate and forming first and second memory arrays along a first direction. The method can also include forming staircase regions and TSC regions between the first and second memory arrays. The method further can include forming staircase structures in the staircase regions and removing portions of the alternating layer stack within the TSC regions to expose the underlying first substrate. The method can also include forming TSCs in the TSC regions and forming an interconnect layer on the TSCs, the interconnect layer electrically coupled to the first substrate. The method further can include forming a first bonding layer on the interconnect layer and bonding the first and second bonding layers using suitable bonding technologies.

In some embodiments, the method for forming TSCs can include disposing an isolation dielectric material in the TSC regions, forming openings in the TSC regions, and disposing conductive material in the openings.

In some embodiments, the method for forming the 3D memory device can include forming connector regions between the first and second memory arrays and forming connectors in the connector regions. The connectors are formed to electrically connect to the first and second staircase structures in the first and second staircase regions, respectively.

In some embodiments, the method for exposing the underlying first substrate can also include forming multiple staircases of different heights in the first and second staircase regions. In some embodiments, each etching step for forming the multiple staircases can also etch portions of the alternating layer stack that are in the TSC regions.

In some embodiments, the method for forming multiple staircases can include determining the height of each staircase of the multiple staircases. Each height of the staircase is equal to a height of a single staircase multiplied by a multiplication factor. In some embodiments, the multiplication factor is an integer value. In some embodiments, the etching depths for forming the multiple staircases equals to a height of a single staircase multiplied by an odd integer number. In some embodiments, the etching process can include simultaneous etching the alternating layer stack in two or more staircase regions, and the etching depth for each etching process equals to a height of a single staircase multiplied by an even integer number.

In some embodiments, the method for forming the staircase structures include providing a masking layer, the masking layer including openings extending in first and second directions. The method can also include performing an etching process using the masking layer to form at least a stair in the staircase regions. The masking layer can also include an opening in the TSC regions and the etching process can also etch a portion of the alternating layer stack in the TSC region. The method can also include trimming the masking layer and etching the alternating layer stack after the trimming. The method further can include repeating the trimming and etching process to form staircases with different height and removing the alternating layer stack in the TSC region concurrently with the formation of aforementioned staircases.

In some embodiments, the staircase regions include first and second staircase regions, and the TSC regions are formed between the first and second staircase regions.

In some embodiments, the TSC region are in contact with and parallel with the first and second staircase regions.

In some embodiments, the method for forming the 3D memory device can also include forming a peripheral circuitry on a second substrate and forming a second bonding layer on the peripheral circuitry. The method further can include bonding the first and second bonding layers using suitable wafer bonding technologies.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
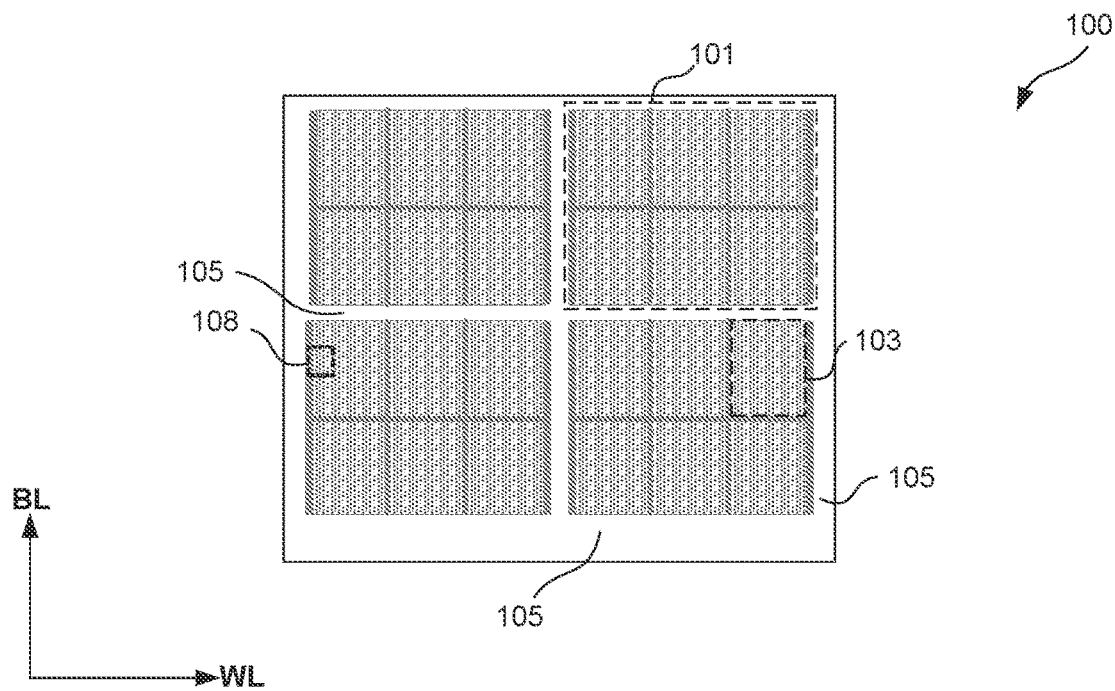
FIG. 1A illustrates a schematic top-down view of an exemplary three-dimensional (3D) memory chip, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

As the development of 3D memory (e.g., 3D NAND flash memory) progress towards high density and high capacity memory cells, the number of staircase layers in 3D memory devices continues to increase. Through silicon contact (TSC) structures extend through the staircase layers and are connected to the structures in the underlying substrate. As more and more staircase layers are stacked on each other, high quality contact structures are becoming more critical to provide reliable electrical connection between memory control circuitry and peripheral devices.

Various embodiments in accordance with the present disclosure provide structures and fabricating methods for contact structures in various regions of a 3D memory structure. For example, through silicon contacts can be formed in a region that extends in parallel with a staircase structure or in a region between two opposing sub-staircase structures. Sub-staircase structures can refer to a portion of a staircase structure that contain a specific number of tiers and extend in a lateral direction. An adjacent sub-staircase structure can include similar number of tiers and extend in an opposite lateral direction. To improve device density and improve real estate efficiency, TSC structures can be formed in a staircase regions. Specifically, one or more operations for forming TSC structure within staircase regions can be performed concurrently with the formation process of staircase structures. For example, a TSC region can be within a staircase region, and the formation of TSC regions includes, for example, removing a portion of an alternating stack of dielectric layers, disposing an isolation dielectric layer in place of the removed portion of the alternating staircase structures, forming openings through the isolation dielectric layer, and disposing conductive material in the openings. In some embodiments, the staircase structures can be formed during a multi-step trim-etch process, referred to as a "multi-chopping" process. Each step of the trim-etch process removes a portion of the alternating stack of dielectric layers within the TSC region such that the alternating stack of dielectric layers are removed within the TSC region once the multi-chopping process is completed. The contact structures and methods for forming the contact structures described in the present disclosure provide various benefits, including but not limited to, improved device density, reduced fabrication cost, among other things.

FIG. 1A illustrates a top-down view of an exemplary 3D memory device 100, according to some embodiments of the present disclosure. 3D memory device 100 can be a memory chip (package), a memory chip or any portion of a memory chip, and can include one or more memory planes 101, each of which can include a plurality of memory blocks 103. Identical and concurrent operations can take place at each memory plane 101. Memory block 103, which can be megabytes (MB) in size, can be the smallest size to carry out erase operations. Shown in FIG. 1A, exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIGS. 1A and 1B. Memory block 103 can include memory arrays which are core areas of a memory device, performing storage functions.

3D memory device 100 also includes a periphery region 105, an area surrounding memory planes 101. Periphery region 105 can contain many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

The arrangements of periphery region 105 and memory planes 101 in 3D memory device 100 as well as the arrangement of memory blocks 103 in each memory plane 101 illustrated in FIG. 1A are only provided as an example, which does not limit the scope of the present disclosure. For example, periphery region 105 can be formed below or above memory planes 101.

Figure 1B:
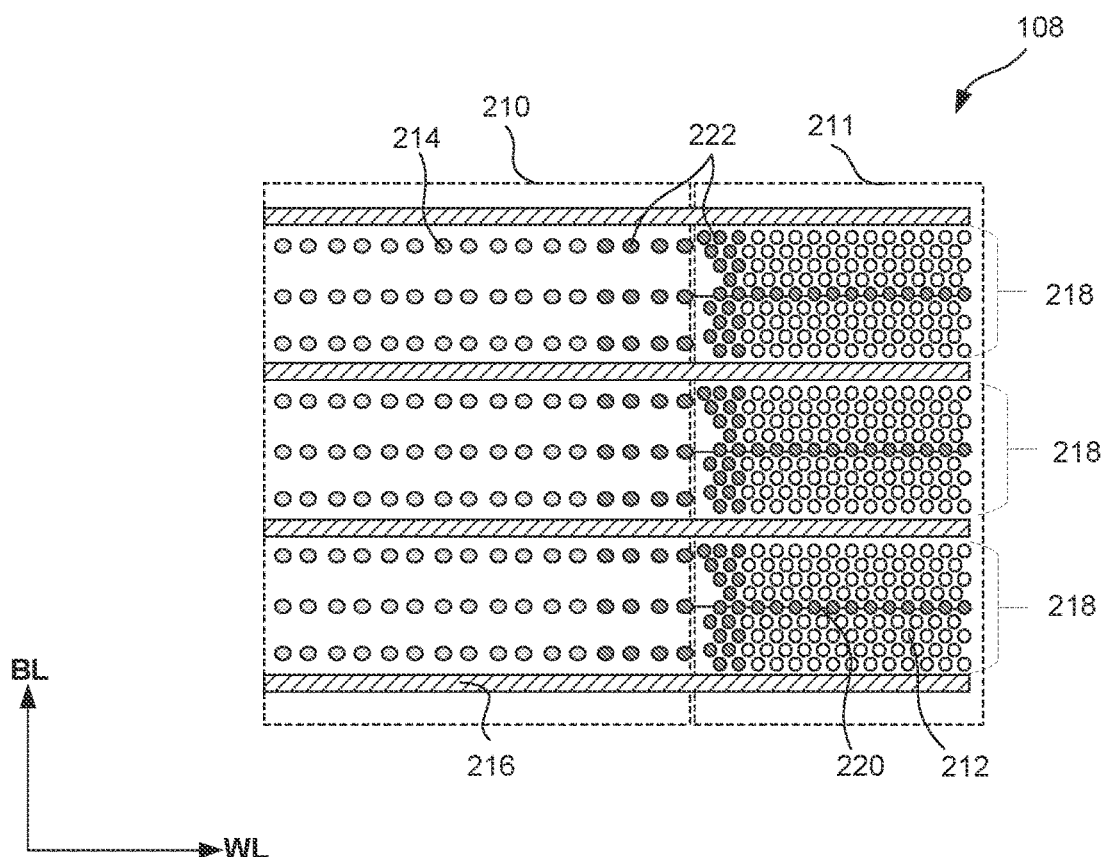
FIG. 1B illustrates a schematic top-down view of a region of a 3D memory chip, according to some embodiments of the present disclosure.

Referring to FIG. 1B, an enlarged top-down view of a region 108 in FIG. 1A is illustrated, according to some embodiments of the present disclosure. Region 108 of 3D memory device 100 can include a staircase region 210 and a core array region 211. Core array region 211 can include an array of channel structure 212, each including a plurality of memory cells. Staircase region 210 can include a staircase structure and an array of contact structures 214 formed on the staircase structure. In some embodiments, a plurality of slit structures 216, extending in WL direction across core array region 211 and staircase region 210, can divide a memory block into multiple memory fingers 218. In some embodiments, slit structures 216 can also be used to divide between different memory fingers. At least some slit structures 216 can function as the common source contact for an array of channel structure 212 in core array region 211. A top select gate cut 220 can be disposed in the middle of each memory finger 218 to divide a top select gate (TSG) of memory finger 218 into two portions, and thereby can divide the memory strings in memory fingers into two regions. While erase operation of a 3D NAND memory can be carried out at memory block level, read and write operations can be carried out at memory page level. A bit line can be electrically connected to a memory string in one page and another memory string in the other page so a data operation can be performed in the memory cells of one page at a time. In some embodiments, region 108 also includes dummy channel structures for process variation control during fabrication and/or for additional mechanical support.

Figure 1C:
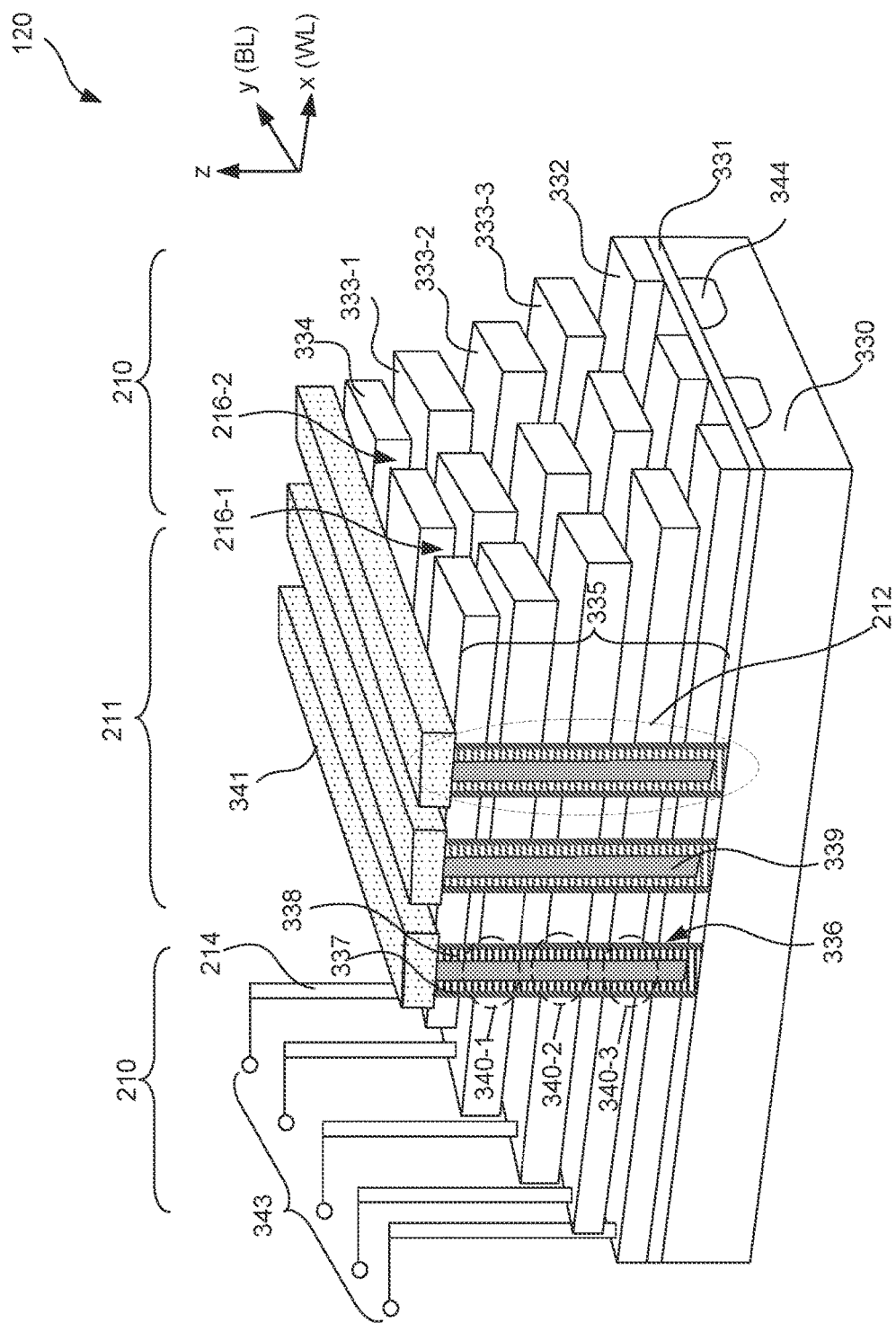
FIG. 1C illustrates a prospective view of a portion of an exemplary 3D memory array structure, according to some embodiments of the present disclosure.

FIG. 1C illustrates a perspective view of a portion of an exemplary 3D structure 120, according to some embodiments of the present disclosure. Structure 120 includes a substrate 330, an insulating layer 331 over the substrate 330, a tier of bottom select gates (BSGs) 332 over the insulating layer 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 1C for clarity. Exemplary 3D structure 120 is only provided as an example and does not limit the scope of the present disclosure. The memory structures described in the present disclosure can be implemented in any suitable memory array structures.

The control gates of each tier are separated by slit structures 216-1 and 216-2 through the film stack 335. In some embodiments, slit structures 216-1 and 216-2 can be discontinuous between staircase region 210 and core array region 211. Structure 120 can include a tier of top select gates (TSGs) 334 over the stack of control gates 333. The stack of TSG 334, control gates 333 and LSG 332 are also referred to as "gate electrodes." Structure 120 further includes channel structure 212 and doped source line regions 344 in portions of substrate 330 between adjacent LSGs 332. Each channel structure 212 includes a channel hole 336 extending through insulating layer 331 and film stack 335 of alternating conductive and dielectric layers. Channel structure 212 can also include a memory film 337 on a sidewall of the channel hole 336, a channel layer 338 over the memory film 337, and a core filling film 339 surrounded by the channel layer 338. A memory cell 340 can be formed at the intersection of control gate 333 and memory string 212. Structure 120 further includes a plurality of bit lines (BLs) 341 connected with channel structure 212 over TSGs 334. Structure 120 also includes a plurality of metal interconnect lines 343 connected with the gate electrodes through a plurality of contact structures 214. The edge of film stack 335 is configured in a shape of staircase to allow an electrical connection to each tier of the gate electrodes.

In FIG. 1C, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. Structure 120 can also include other structures, for example, TSG cut, common source contact and dummy channel structure. These structures are not shown in FIG. 1C for simplicity.

To achieve higher storage density, the number of vertical WL stacks of a 3D memory or the number of memory cells per memory string has been greatly increased, for example, WL stacks can exceed 60 or 90 layers or more. Further increasing the number of vertical WL stacks brings challenges for forming channel structures that extend through the vertical WL stacks. For example, channel openings having high aspect ratios (e.g., ratio of height over width) can lead to over-etching of the upper portion of the openings and under-etching of the lower portions of the opening. The non-uniform etching can lead to cross-talk or undesirable coupling between adjacent memory cells, such as memory cells 340-1, 340-2, and 340-3 illustrated in FIG. 1C.

Figure 1D:
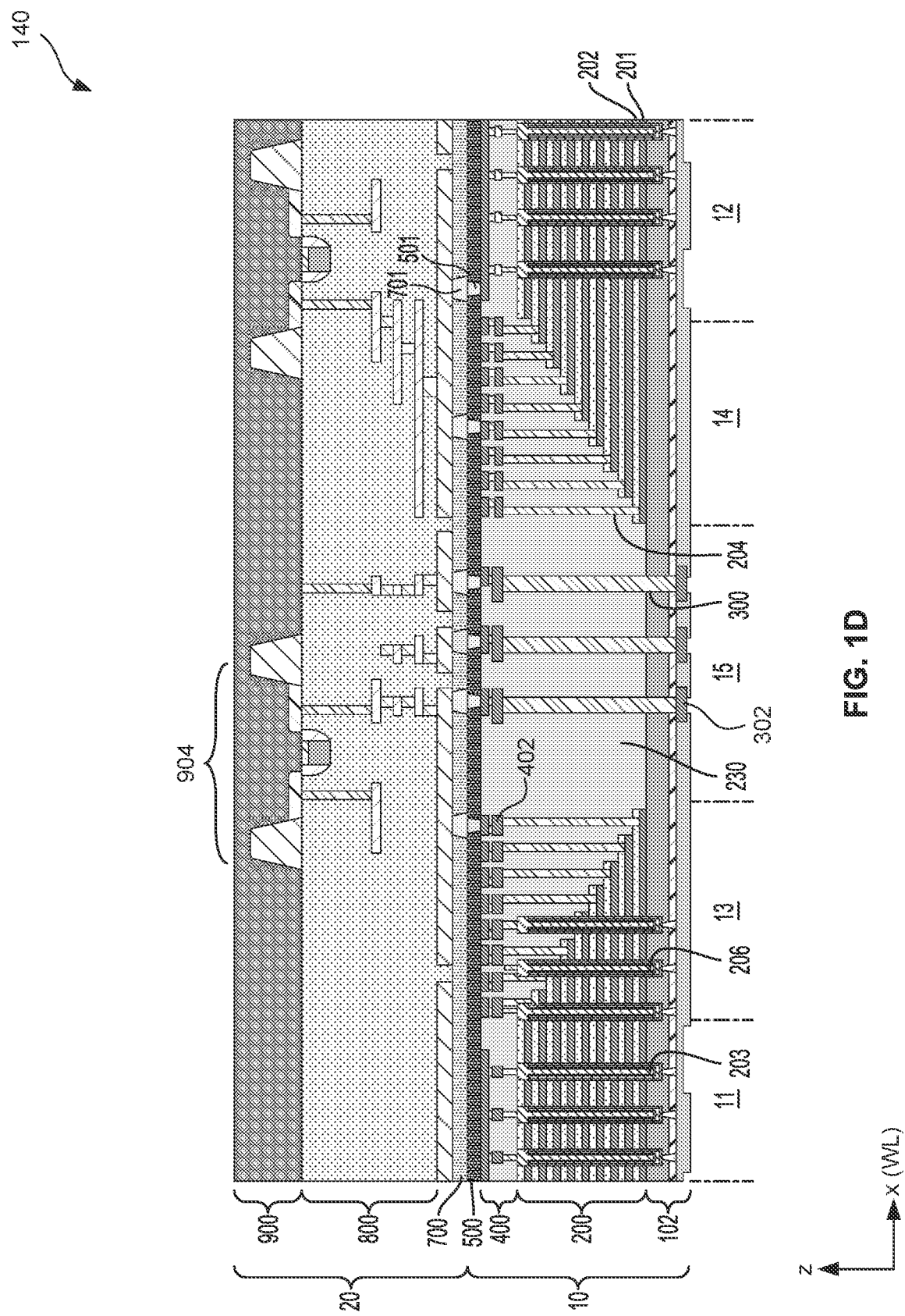
FIG. 1D illustrates cross-sectional view of an exemplary 3D memory array structure, according to some embodiments of the present disclosure.

FIG. 1D illustrates an exemplary 3D memory structure, according to some embodiments. Memory structure 140 illustrated in FIG. 1D includes a first semiconductor structure such as a memory chip 10 and a second semiconductor structure such as a peripheral chip 20. Other suitable structures can be used as the first and second semiconductor structures. In some embodiments, peripheral chip 20 is formed over and electrically coupled to memory chip 10.

Memory chip 10 includes at least a first substrate 102, a layer stack 200, through-silicon contact (TSC) 300, an interconnection layer 400, and a first bonding layer 500.

First substrate 102 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, indium phosphide, gallium arsenide, glass, III-V compound, any other suitable materials or any combinations thereof. In some embodiments, first substrate 102 can be double-side polished prior to device fabrication. In some embodiments, first substrate 102 can have patterns on its backside surface, as shown in FIG. 1D. First substrate 102 in FIG. 1D is only provided as an example, which does not limit the scope of the present disclosure. For example, first substrate 102 can be a dielectric layer or any suitable material or structure. In some embodiments, first substrate 102 can include a polysilicon material.

Layer stack 200 includes alternatingly formed control gates 201 and dielectric layer 202. For example, layer stack 200 can include pairs of control gates 201 and dielectric layers 202 alternatingly disposed on substrate 102. Each pair of control gate 201 and dielectric layer 202 can be considered as a level (e.g., a step) of 3D memory structure 140. In some embodiments, layer stack 200 can include any suitable amount of levels, such as 60 levels, 90 levels, or more. Layer stack 200 can be formed by alternatingly disposing two dielectric layers and replacing one of the two dielectric layers using a conductive layer. Control gates 201 and dielectric layer 202 can be disposed using one or more thin-film deposition processes including, but not limited to, chemical vapor deposition (CVD), plasma-enhanced CVD (PECVD), physical vapor deposition (PVD), atomic layer deposition (ALD), plasma-enhanced ALD (PEALD), or any combination thereof. In some embodiments, control gates 201 also includes at least one of a top selection gate structure and a bottom gate selection structure.

Along the word line direction (e.g., x direction), layer stack 200 can be divided into various regions, such as first and second memory arrays 11 and 12 that contain channel structures. Staircase structures can be formed between first and second memory arrays 11 and 12. The staircase structures can be electrically coupled to one or more memory arrays. For example, layer stack 200 also includes first and second staircase regions 13 and 14, respectively coupled to first and second memory arrays 11 and 12. A contact region 15 is formed between first and second staircase regions 13 and 14. In some embodiments, first and second staircase regions 13 and 14 surround contact region 15. In some embodiments, contact region can be formed within staircase regions.

Insulating layer 230 is disposed on layer stack 200. For example, insulating layer 230 can be disposed on staircase structure in first and second staircase regions 13 and 14. In some embodiments, insulating layer 230 can also be disposed in contact region 15. In some embodiments, insulating layer 230 can be formed using any suitable insulating material. For example, insulating layer 230 can be formed using silicon oxide, silicon nitride, silicon oxynitride, any suitable dielectric materials, and/or combinations thereof.

Layer stack 200 can also include various channel structures. For example, layer stack 200 can include channel structures 203 and dummy channel structures 206.

Channel structures 203 are formed in first and second memory array 11 and 12. Each channel structure 203 extends through alternating layers of control gates 201 and dielectric layers 202. Channel structures 203 can include a tunneling layer, a storage layer, and a blocking layer, arranged along a direction from the center of each channel structure 203 toward the layer stack 200, according to some embodiments. Portions of channel structures 203 in contact with a top or bottom selection structure can include a blocking layer and a storage layer.

Dummy channel structures 206 can also be formed through layer stack 200. In some embodiments, structures and compositions of dummy channel structures 206 can be similar to channel structures 203, except that top portions of dummy channel structures 206 may not contain contact structures for connecting to conductive lines. In some embodiments, dummy channel structures can be filled with insulating materials.

Contact region 15 can include TSCs 300. In some embodiments, TSCs 300 can extend through substrate 102 and be in contact with contact pads such as contact pads 302. TSCs 300 can be configured to be electrically coupled to external electrical connections (not illustrated in FIG. 1D) through contact pads 302. TSCs 300 can be used for transmitting signals to devices embedded in substrate 102 or external circuitry. In some embodiments, each TSC 300 can include a conductive structure extending in the vertical direction (e.g., z direction) and surrounded by an insulating layer.

Contact structures 204 can be formed on layer stack 200. Each contact structure 204 can extend through insulating layer 230 and a dielectric layer 202, such that a bottom surface of contact structure is in contact with and electrically coupled to a control gate 201. Top surfaces of contact structures 204 can be connected to a contact structure 402 of interconnection layer 400.

Interconnection layer 400 is formed above layer stack 200 and connected to channel structures 203, contact structures 204, TSCs 300, and any other suitable structures of memory structure 140. Interconnection layer 400 can include conductive lines extending laterally and vias for connecting conductive lines on different levels. In some embodiments, interconnection layer 400 can be in contact with first bonding layer 500.

For 3D memory structures with higher number of layers, such as memory structures with 60, 90, or more stacked WL layers, forming staircase regions and TSCs between memory arrays can provide various benefits. For example, the horizontal length of interconnections can be reduced compared to structures with TSCs formed between storage regions, which in turn reduces resistance and increases device density.

Peripheral chip 20 includes at least a second bonding layer 700, a peripheral circuit 800, and a second substrate 900. Peripheral chip 20 can include any other suitable structures and are not illustrated in FIG. 1D for simplicity.

Second bonding layer 700 can be formed using a similar material as first bonding layer 500. For example, first and second bonding layers 500 and 700 can be formed using a dielectric material, such as silicon oxide, silicon nitride, silicon oxynitride, any suitable dielectric material, and/or combinations thereof. In some embodiments, first and second bonding layers 500 and 700 can be formed using different materials.

Peripheral circuit 800 can include any suitable semiconductor devices, for example, low-voltage or high-voltage devices, metal oxide semiconductor field effect transistors (MOSFETs), bipolar junction transistors (BJTs), diodes, resistors, capacitors, inductors, etc. Peripheral circuit 800 also includes interconnect structures. For example, peripheral circuit 800 can include vias and conductive lines electrically connected to circuitry formed in peripheral circuit 800 and substrate 900. The interconnect structures can be electrically connected to circuitry formed in memory chip 10 through bonding pads embedded in first and second bonding layers 500 and 700.

Second substrate 900 can be formed using similar material as first substrate 102. In some embodiments, peripheral circuit 800 and second substrate 900 can include suitable CMOS devices 904. In some embodiments, second substrate 900 can be any suitable structures, such as semiconductor layers or dielectric layers.

Peripheral chip 20 can be fabricated separately from memory chip 10 and flipped over to be bonded to memory chip 10. In some embodiments, first bonding layer 500 and second bonding layer 700 are pressed against each other and bonded using suitable bonding technologies, such as hybrid bonding technologies. In some embodiments, contact pads 501 of first bonding layer 500 and contact pads 701 of second bonding layer 700 are aligned and bonded together.

Figure 2:
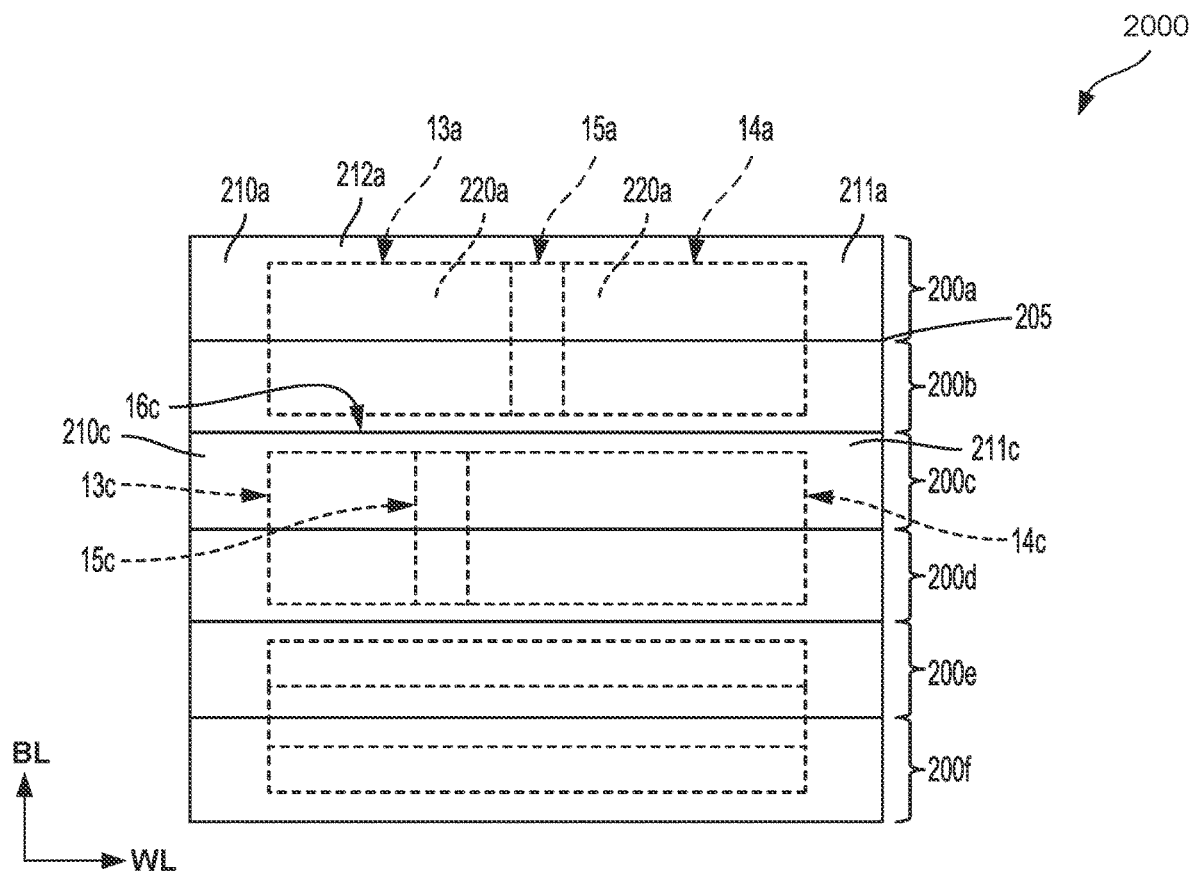
FIGS. 2 and 3 illustrate schematic top-down views of regions of a 3D memory chip, according to some embodiments of the present disclosure.

FIG. 2 illustrates a schematic top-down view of a region of a 3D memory chip, according to some embodiments of the present disclosure. 3D memory device 2000 includes memory regions 200a-200f. Each memory region (e.g., a memory finger or a block) is separated from an adjacent memory region by a slit structure 205, such as a gate line slit (GLS). Each slit structure extends laterally along the WL direction in a straight-line pattern in the plan view (parallel to the wafer plane). In some embodiments, slit structure 205 separates first memory region 200a from adjacent second memory region 200b. In some embodiments, slit structure 205 is optional and may not be formed between adjacent memory regions. For example, slit structure 205 can be omitted between first and second memory regions 200a and 200b, between third and fourth memory regions 200c and 200d, and/or between fifth and sixth memory regions 200e and 200f. In some embodiments, slit structure 205 can be discontinuous in a staircase region. 3D memory device 2000 can be further include any other suitable memory regions and are not illustrated in FIG. 2 for simplicity. In some embodiments, first memory region 200a includes first memory array 210a and second memory array 211a. Staircase structures 220a are formed in first and second staircase regions 13a and 14a respectively. Staircase structures 220a are also formed between first and second memory arrays 210a and 211a. Connectors 212a are used to electrically couple staircase structures 220a to at least one of first memory array 210a and second memory array 211a. In some embodiments, connectors can also be referred to as bridge structures and regions that form connectors can be referred to as bridge regions. First TSC region 15a is formed between two portions of staircase structures 220a.

Third memory region 200c includes first and second memory arrays 210c and 211c. First staircase region 13c and second staircase region 14c can be formed between first memory array 210c and second memory array 211c. TSC region 15c can be formed between and abut (e.g., in direct contact with) first and second staircase regions 13c and 14c. Connectors 16c can be formed in first staircase region 13c, second staircase region 14c, and TSC region 15c.

Other memory regions can also be formed in 3D memory device 2000. For example, fifth memory region 200e includes at least a first memory array 210e, a second memory array 211e, connectors 212e, and staircase structures 220e.

Figure 3:
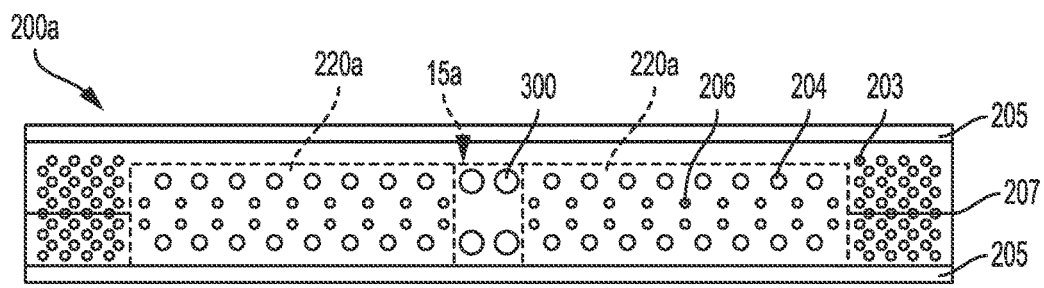

FIG. 3 illustrates a schematic top-down view of a memory region of a 3D memory chip, according to some embodiments of the present disclosure. Specifically, FIG. 3 is an enlarged view of first memory region 200a of FIG. 2. As shown in FIG. 3, first memory region 200a is a portion of layer stack 200 that is separated by slit structure 205. First memory region 200a includes channel structures 203 that can be divided into two groups by top selection gate cut 207. In some embodiments, top selection gate cut 207 can extend into the staircase regions. In some embodiments, first memory region 200a also includes contact structures 204 and dummy channel structures 206. First TSC region 15a including TSCs 300 is formed between staircase structures 220a.

Figure 4:
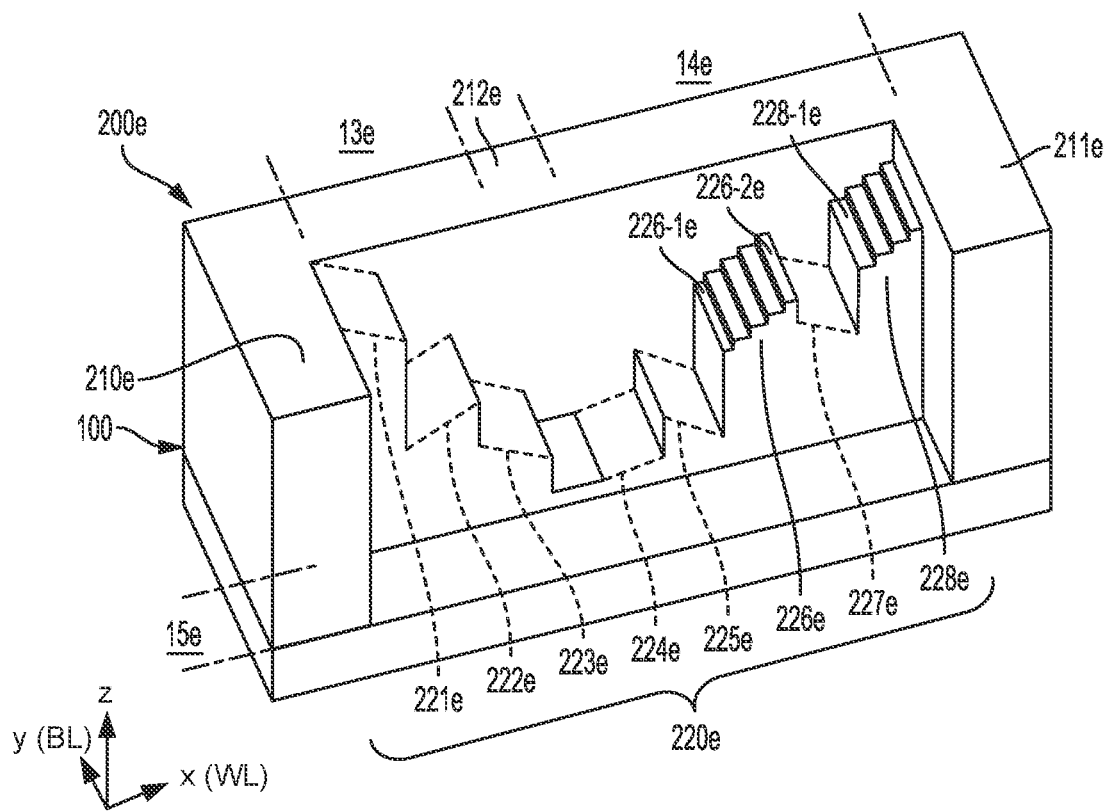
FIGS. 4 and 5 respectively illustrate a schematic prospective view and a top-down view of a memory region of a 3D memory device, according to some embodiments of the present disclosure.
Figure 5:
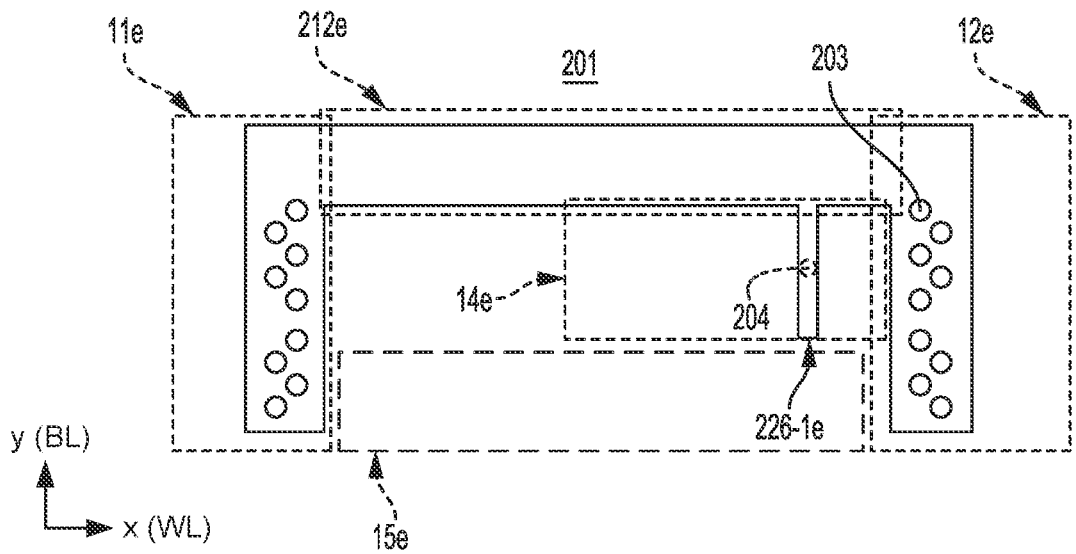

FIGS. 4 and 5 respectively illustrate a schematic prospective view and a top-down view of a memory region of a 3D memory chip, according to some embodiments of the present disclosure. For example, FIG. 4 is an enlarged schematic prospective view of fifth memory region 200e of FIG. 2 that includes at least a first memory array 210e, a second memory array 211e, connectors 212e, and staircase structures 220e. FIGS. 4 and 5 illustrate portions of the memory arrays, and additional structures such as additional memory arrays are not illustrated for simplicity. For example, fifth memory array 200e can include other suitable structures and are not illustrated in FIGS. 4 and 5 for simplicity. FIGS. 4 and 5 illustrate TSC regions formed in parallel with staircase structures, among other things.

Staircase structure 220e can include multiple staircases 221e-228e. In some embodiments, staircases 221e-228e can also be referred to as sub-staircases. In some embodiments, each of staircase 221e-228e can abut (e.g., in direct contact with) an adjacent staircase. For example, staircase 221e can be abutting staircase 222e. Each of the staircases includes at least one or more stairs, and the bottom-most stair can be a part of a control gate 201 (not illustrated in FIG. 4). In some embodiments, staircase structure 220e includes multiple adjacent pairs of staircases that have stairs descending in directions opposite to each other. For example, staircase 221e is adjacent to staircase 222e, the former contains stairs descending in an x direction and the latter contains stairs descending in a negative x direction. Staircase 222e can also be formed at a horizontal level below staircase 221e, as shown in FIG. 4. Specifically, a top-most stair of staircase 222e can be formed below a bottom-most stair of staircase 221e. At least one stair of each of staircases 221e-228e is electrically connected to first or second memory arrays 210e and 211e through connectors 212e. In some embodiments, connectors 212e can be divided into two portions connected to first and second memory arrays 210e and 211e, respectively.

Each staircase of staircase structure 220e can contain a suitable amount of stairs. For example, staircases 226e and 228e illustrated in FIG. 4 can each have five steps. Schematic illustration of steps for other staircases are omitted from FIG. 4 for simplicity. In some embodiments, the bottom-most step 226-1e of staircase 226e can be electrically coupled to first memory array 210e and/or second memory array 211e through connectors 212e. Referring to FIGS. 4 and 5, control gates of fifth memory region 200e can be formed in at least first storage region 11e, second storage region 12e, second staircase region 14e, and connector region 212e. Each contact structure 204 extends through dielectric layer 230 to become in physical contact with a level of the stair structure.

A TSC region 15e is formed between first memory array 210e and second memory array 211e. In some embodiments, TSC region 15e can be formed extending in the word line direction (e.g., x direction) and in parallel with the staircase structures. An isolating dielectric material can be subsequently disposed in TSC region 15e and TSCs can be formed extending through the isolating dielectric material in TSC region 15e.

Staircases 221e-228e can be formed at different levels along the vertical direction (e.g., z direction). In some embodiments, a pair of staircases, such as opposing staircases 221e and 222e, can be formed at different vertical levels. For example, a bottom-most stair of staircase 221e can be formed in a horizontal plane that is above another horizontal plane in which a top-most stair of staircase 222e is formed. As another example, staircase 226e can be formed below staircase 228e. Specifically, a top-most stair 226-2e of staircase 226e can be at a horizontal plane below a horizontal plane in which bottom-most stair 228-1e of staircase 228e is formed. Each stair of staircases 221e-228e can be connected to a corresponding contact 204 (not illustrated in FIG. 4 for simplicity).

Figure 6:
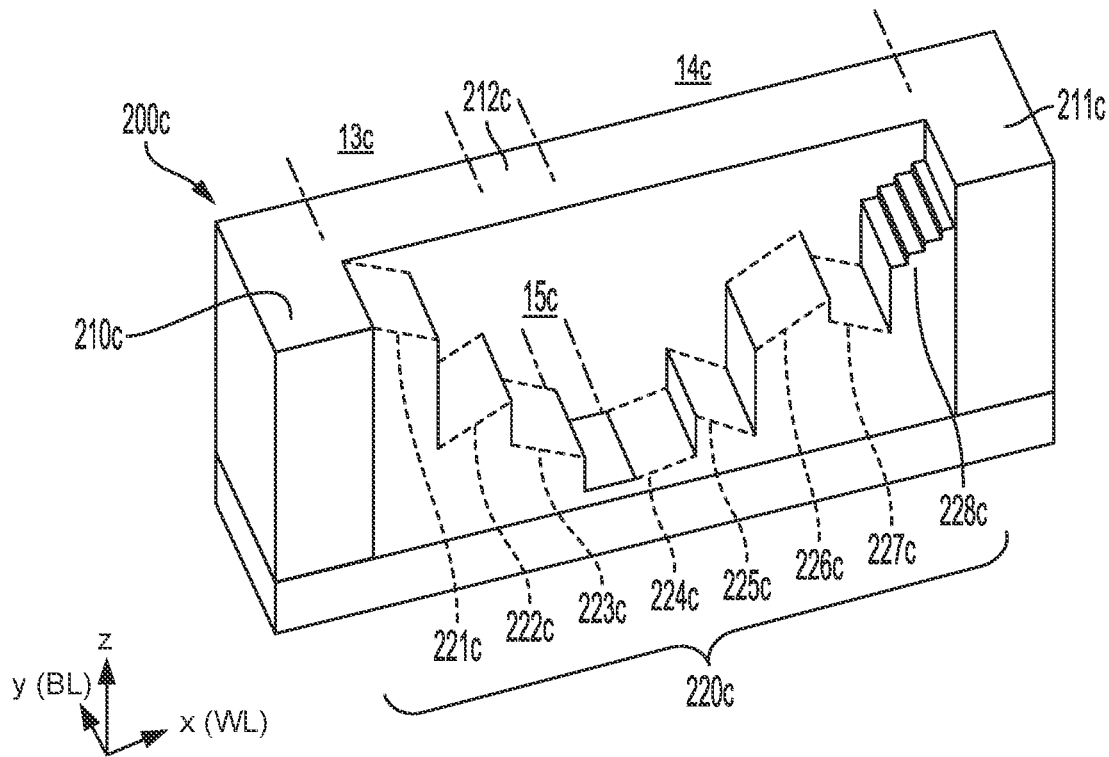
FIGS. 6 and 7 respectively illustrate a schematic prospective view and a top-down view of a memory region of a 3D memory device, according to some embodiments of the present disclosure.
Figure 7:
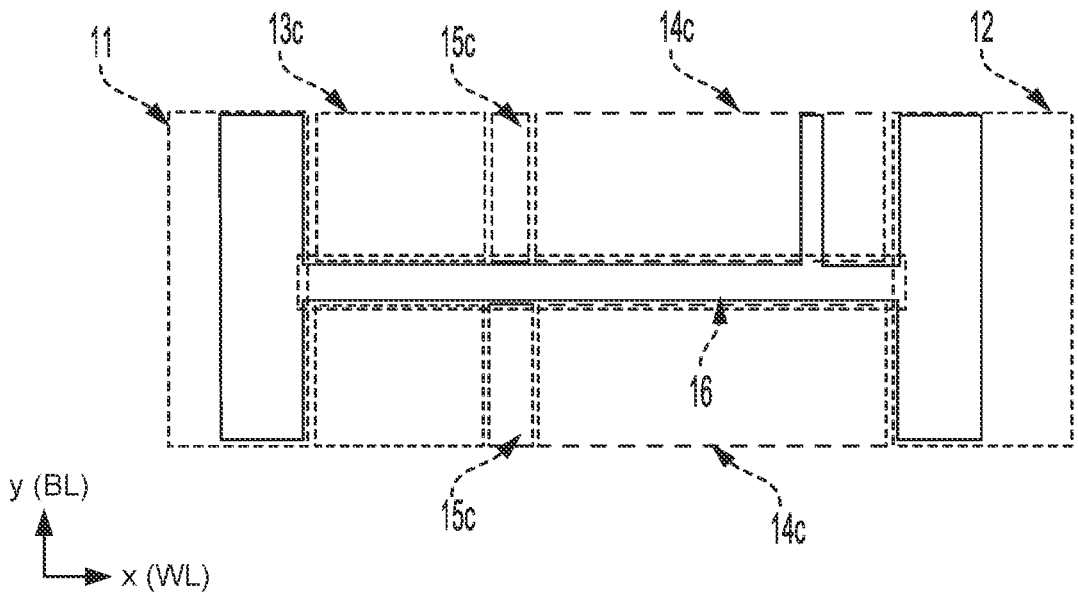

FIGS. 6 and 7 respectively illustrate a schematic prospective view and a top-down view of a memory region of a 3D memory chip, according to some embodiments of the present disclosure. For example, FIG. 6 is an enlarged schematic prospective view of third memory region 200c of FIG. 2 that includes at least a first memory array 210c, a second memory array 211c, connectors 212c, and staircase structures 220c. Third memory array 200c can include other suitable structures and are not illustrated in FIGS. 6 and 7 for simplicity. FIGS. 6 and 7 illustrate TSC regions formed within staircase regions and in between opposing staircase structures.

Similar to staircase structure 220e illustrated in FIG. 4, staircase structure 220c can include multiple staircases 221c-228c formed between first and second memory arrays 210c and 211c. In some embodiments, staircase structure 220c includes multiple staircases that have slopes opposing each other. A TSC region can be formed in between a pair of opposing staircase structures. For example, TSC region 15c can be formed between opposing staircases 223c and 224c. In other words, staircase structure 220c can be divided into two staircase regions by TSC region 15c. For example, a first staircase region can include staircases 221c-223c and a second staircase region can include staircases 224c-228c. Although one TSC region 15c is illustrated in FIG. 6, additional TSC regions can be formed between other suitable staircases of 221c-228c. As shown in FIG. 6, staircase 223c contains stairs descending in an x direction and staircase 224c contains stairs descending in a negative x direction. In some embodiments, staircases 223c and 224 each contains stairs descending in the same direction, such as the x direction or the negative x direction. In another example, staircase structures 221c and 223c can each include stairs descending in the positive x direction, whereas staircase structure 222c formed abutting staircase structures 221c and 223c includes stairs descending in the negative x direction. An isolating dielectric material can be subsequently disposed in TSC region 15c and TSCs can be formed extending through the isolating dielectric material in TSC region 15c. In some embodiments, TSC region 15c can extend in the bit line direction (e.g., y direction). In some embodiments, connector region 16 can extend in the word line direction and formed between first and second storage regions 11 and 12. In some embodiments, connector region 16 can be formed through a region (e.g., a center region) of third memory region 200c. Specifically, staircase structures, such as first and second staircase structures 13c and 14c, can be formed on both sides of connector region 16. Connectors 212c can be formed within connector region 16.

Figure 8:
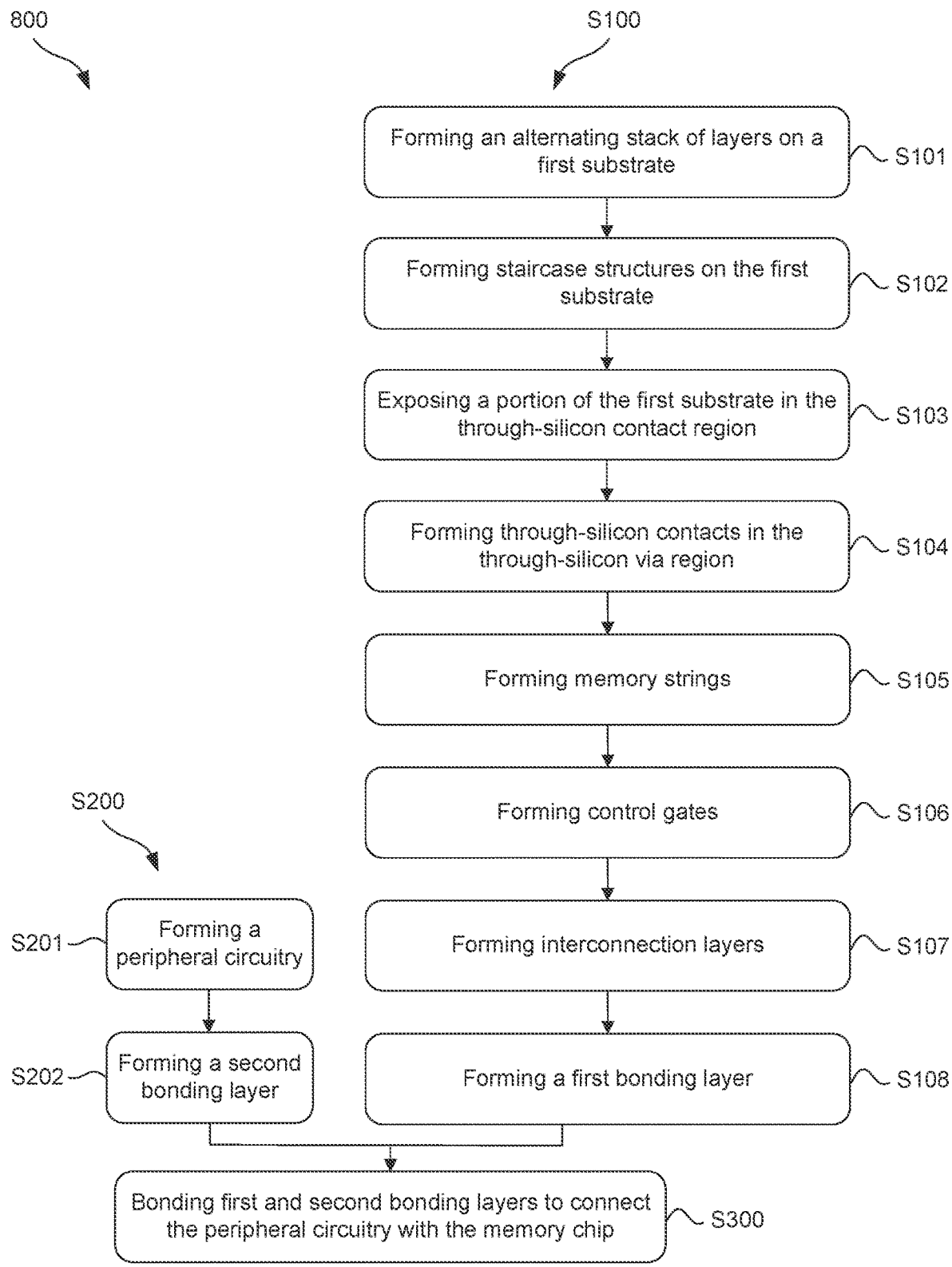
FIG. 8 illustrates a flow diagram of forming contact structures in a 3D memory device, according to some embodiments of the present disclosure.

FIG. 8 is a flow diagram of an exemplary method 800 for forming TSC structures in 3D memory devices, in accordance with some embodiments of the present disclosure. The operations of method 800 can be performed in a different order and/or vary, and method 800 can include more operations that are not described for simplicity. FIGS. 9-23 are various views of masking patterns and exemplary semiconductor structures for forming TSC structures. FIGS. 9-23 are provided as exemplary cross-sectional views to facilitate in the explanation of method 800. FIGS. 9-18 are provided to illustrate an exemplary patterning and lithography process for forming third memory region 200c of FIGS. 2 and 6. FIGS. 19-23 are provided to illustrate an exemplary patterning and lithography process for forming third memory region 200e of FIGS. 2 and 4. Although the fabrication process of forming TSC structures within or adjacent to staircase regions is described here as an example, the fabrication process can be applied to form TSC in any suitable regions of a 3D memory device. The fabrication processes provided here are exemplary, and alternative processes in accordance with this disclosure can be performed that are not shown in these figures.

Method 800 includes operation S100, S200, and S300. Specifically, operation S100 includes operations for forming a memory chip that contains TSC regions in staircases regions, among other things. Operation S200 includes operations for forming a peripheral chip, among other things. Operation S300 includes operations for bonding the memory chip and the peripheral chip using suitable bonding technologies.

Referring to FIG. 8, at operation S101 of operation S100, an alternating layer stack can be disposed on a first substrate, according to some embodiments. In some embodiments, a dielectric layer and a sacrificial layer can be alternatingly disposed on the first substrate. Examples of the first substrate and the dielectric layer can be first substrate 102 and dielectric layers 202. The sacrificial layer can be formed prior to the formation of control gates 201. In some embodiments, the sacrificial layer can be formed using silicon nitride.

Referring to FIG. 8, at operation S102 of operation S100, staircase structures can be formed on the first substrate, according to some embodiments. For example, staircase structures can be formed in different regions of the alternating stack of layers formed in operation S101. Staircase structures can be divided into multiple regions, such as first and second staircase regions. In some embodiments, alternating dielectric layer stack within TSC regions can be removed concurrently during the patterning and etching of the staircase structures. In some embodiments, TSC regions are formed within a staircase region and between opposing sub-staircase structures, as described with reference to FIGS. 6 and 9-18. In some embodiments, TSC regions are formed adjacent to and/or in parallel with a staircase region, as described with reference to FIGS. 4 and 19-23. TSC regions can be formed in any suitable areas in the staircase region to reduce device footprint, improve device density, and reduce conduct line length which in turn reduce power consumption. Merely for the ease of description, staircase regions or staircase structures can contain multiple sub-staircase structures. A sub-staircase structure can also be referred to as a staircase structure itself and can include multiple ascending or descending stairs.

Figure 9:
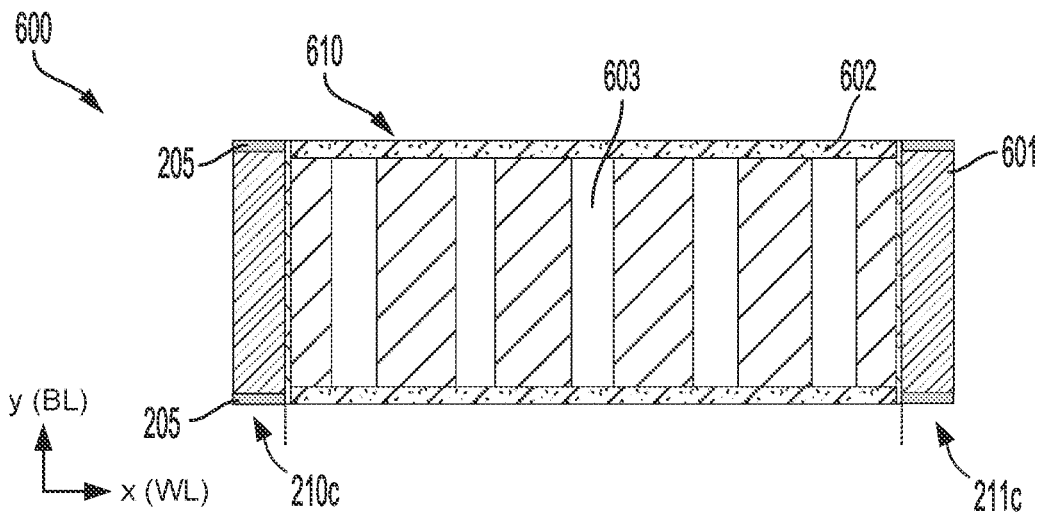
FIGS. 9-23 illustrate various masking patterns of masking layers and corresponding cross-sectional views of 3D memory devices at various process stages, according to some embodiments of the present disclosure.
Figure 14:
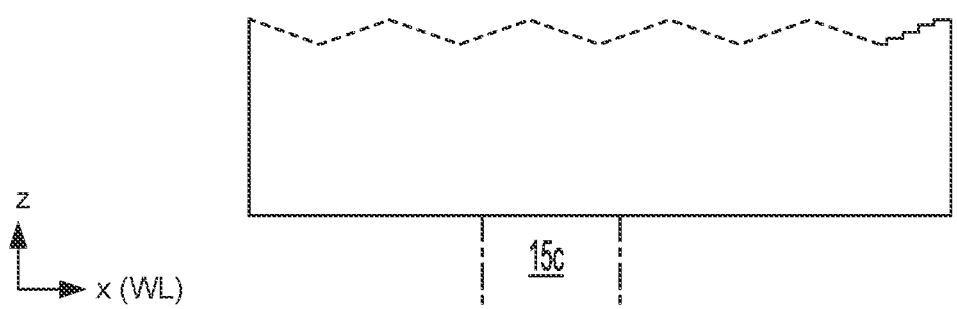
Figure 15:
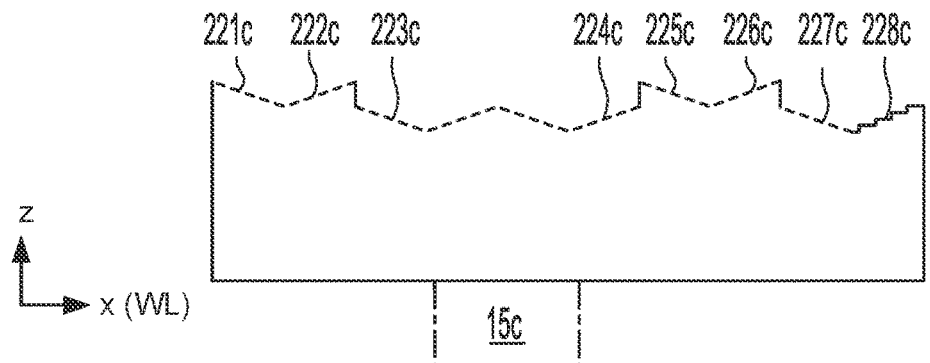
Figure 16:
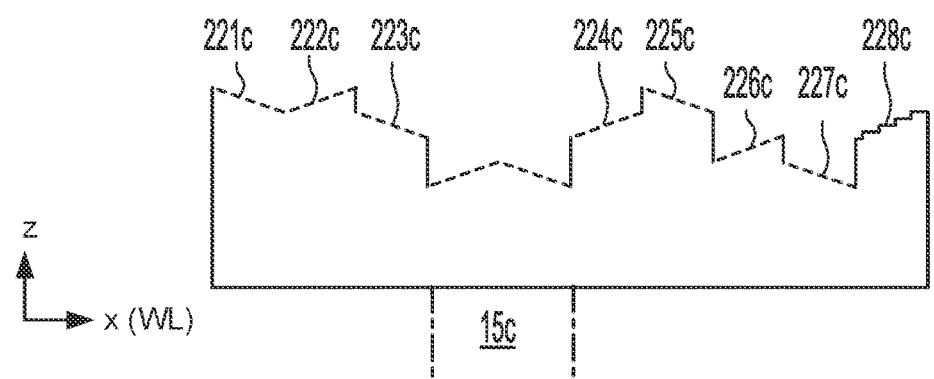
Figure 17:
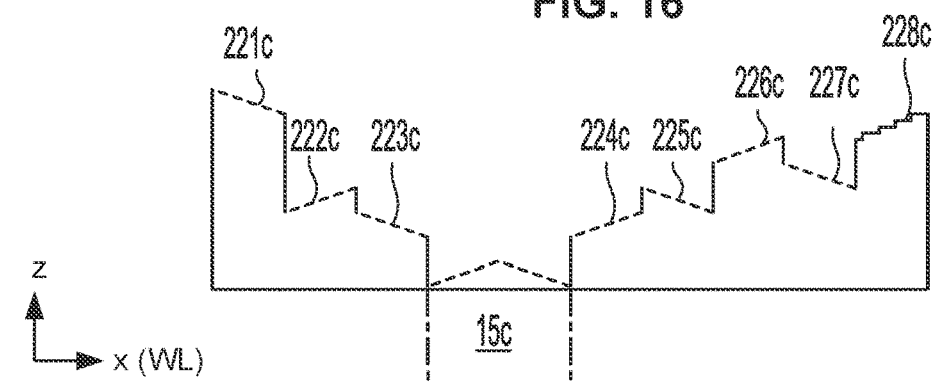

TSC regions can be formed within a staircase region and between opposing sub-staircase structures, as described with reference to FIGS. 6 and 9-18. Referring to FIG. 9, masking layer 600 includes openings corresponding to staircase regions and TSC regions. Specifically, masking layer 600 includes staircase pattern 610 having pattern 601 for covering first and second memory arrays 210*c* and 211*c*. Staircase pattern 610 also includes openings for forming slit structures 205. In some embodiments, staircase pattern 610 also includes opening 603 extending in the bit line direction (e.g., y direction). Openings 603 can determine the number of pairs of staircases facing each other, therefore, the number of opening 603 can depend on the arrangement of the staircase structure in the final product of the memory device. Each opening 603 can have a substantially rectangular shape. Masking layer 610 can also include patterns 602 for forming connector regions. In some embodiments, connector regions can be electrically coupled to first and/or second memory arrays 210*c* and 211*c*. In some embodiments, masking layer 600 can be a hard mask formed using any suitable material, such as polycrystalline silicon, high-k dielectric material (e.g., material having dielectric constant greater than about 3.9), any suitable material, and/or combinations thereof. Masking layer 600 can be used as an etch mask to etch the underlying exposed portions of alternating dielectric layer stack. An etching process can be used to etch underlying material using masking layer 600 as an etch mask. The initial etching process forms a uniform staircase structure (e.g., each staircase formed at the same horizontal level) as shown in FIG. 14.

After the initial etching process is completed, one or more trim masks can be used in subsequent trim-etch processes for forming staircases and other suitable structures. Trim masks 620-650 are described with reference to FIGS. 10-13. Each of trim masks 620-650 includes at least an opening in substantially the same region for forming TSC region 15*c*, such that each trim-etch process removes a portion of the underlying material in TSC region 15*c* until a top surface of the underlying substrate is exposed. In some embodiments, trim masks 620-650 can be soft masks (e.g., photoresist masks) that can be trimmed in the trim-etch process for forming staircases. In some embodiments, masking layer 600 can be formed by coating a photoresist layer using spin coating and patterning the coated photoresist layer using lithography and development processes.

The trim-etch process can form staircase structures having different heights.

Referring to FIG. 6, staircases 221*c*-228*c* can each be formed at different heights. The height of each staircase is determined by a corresponding etching depth as measured from a top surface of first and second memory arrays 210*c* and 211*c* to a top surface of the top-most stair of each of staircases 221*c*-228*c*. In some embodiments, an etching depth of a corresponding structure can be calculated by multiplying a height of a staircase structure by a multiplication factor. In some embodiments, the multiplication factor is an integer value. As an example, the multiplication factors for staircases 221*c*-223*c*, TSC region 15*c* (having a width substantially equivalent to two times the width of a staircase), and staircases 224*c*-228*c*, are respectively 0, 4, 5, 8, 8, 7, 6, 2, 3, and 1.

Figure 10:
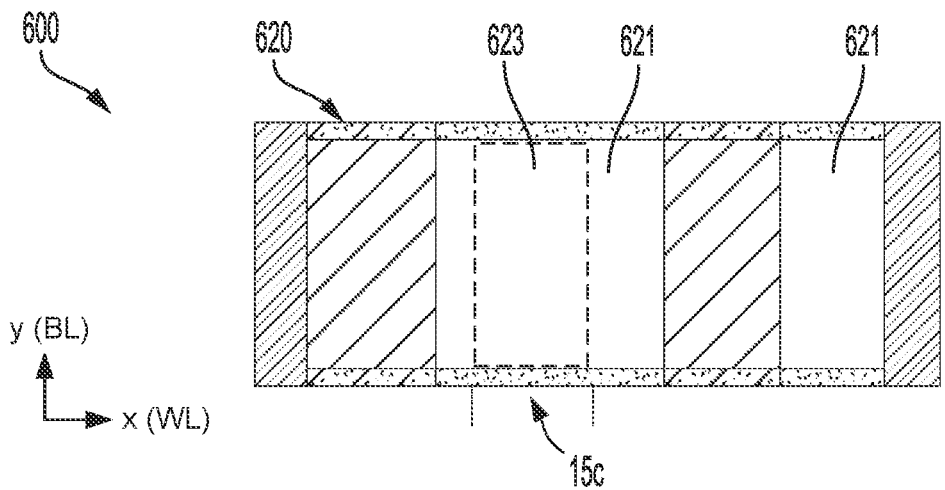
Figure 11:
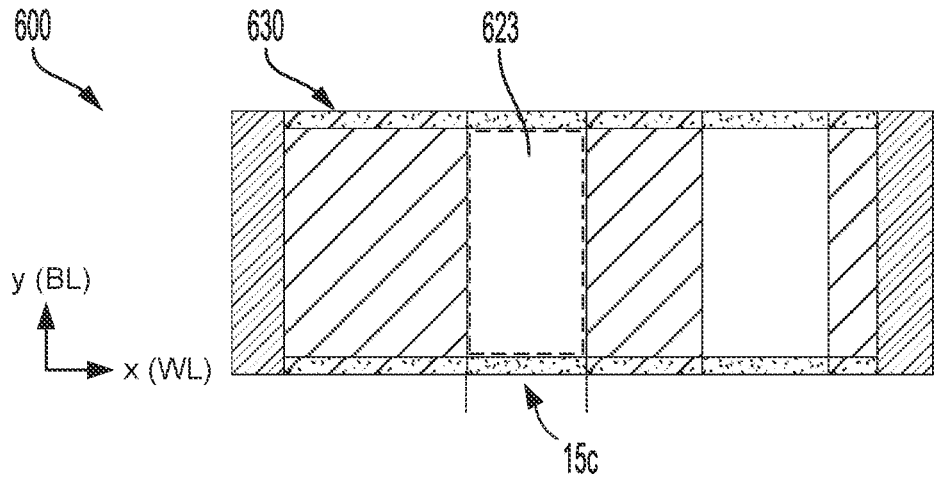
Figure 12:
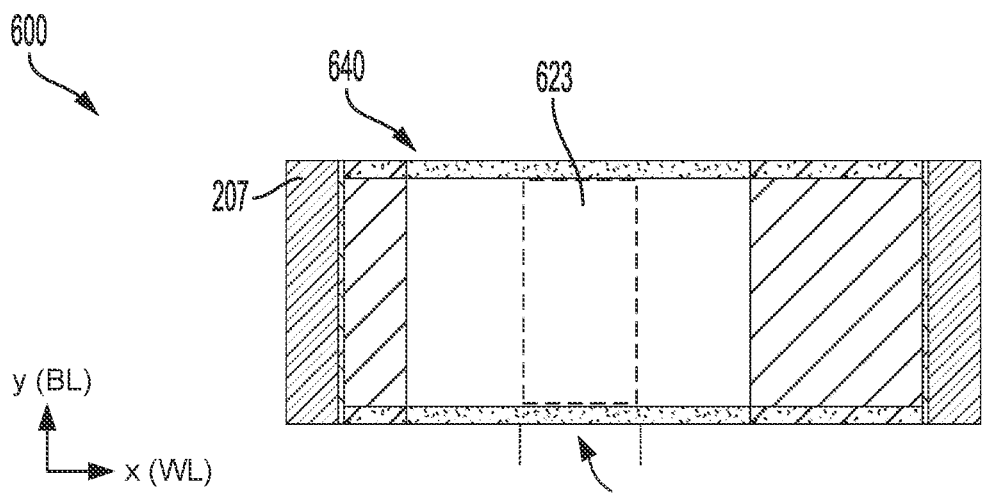
Figure 13:
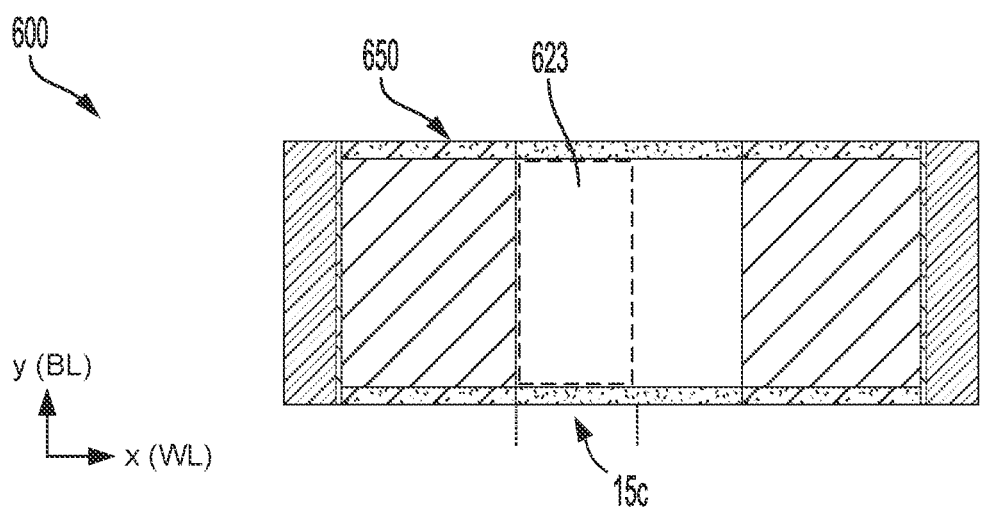

A first trim-etch process uses trim mask 620 illustrated in FIG. 10 to perform a first etching process. Trim mask 620 includes openings 621 that exposes staircases 223*c*, 224*c*, 227*c*, 228*c*, and TSC region 15*c*. Region 623 represents a region on trim masks 620-650 that is transparent such that TSC region 15*c* is exposed to multiple etching process of the trim-etch process. Second, third, and fourth trim-etch processes respectively uses trim masks 630, 640, and 650 as etch masks to form the structures illustrated in FIGS. 16, 17, and 18, respectively.

Figure 19:
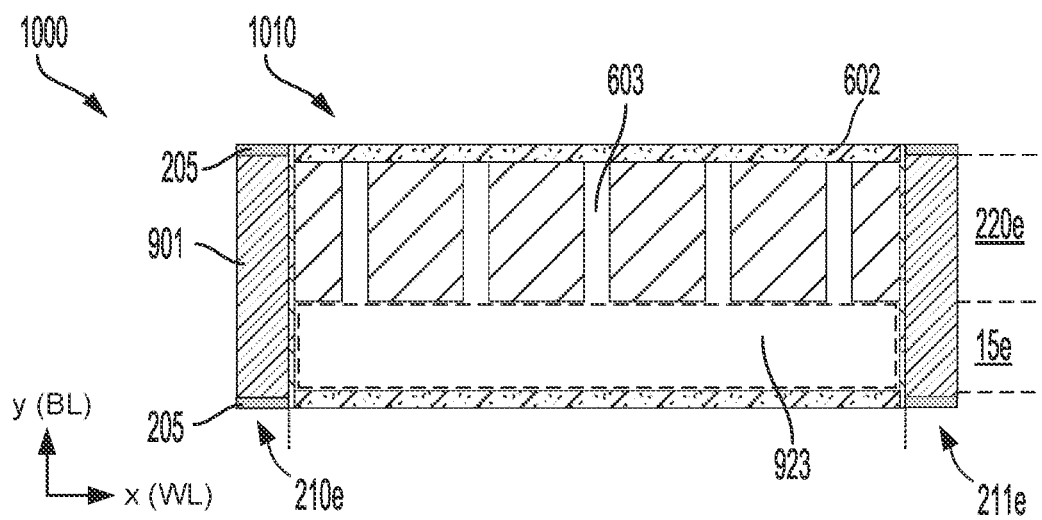
Figure 20:
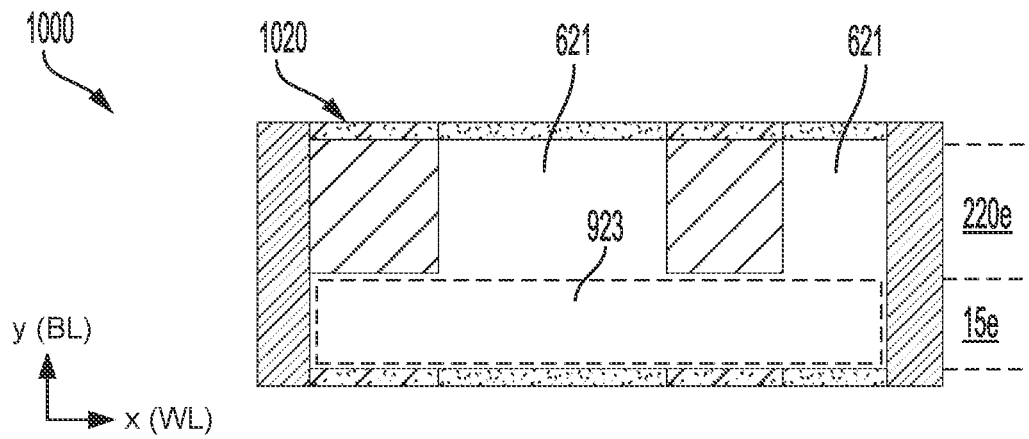
Figure 21:
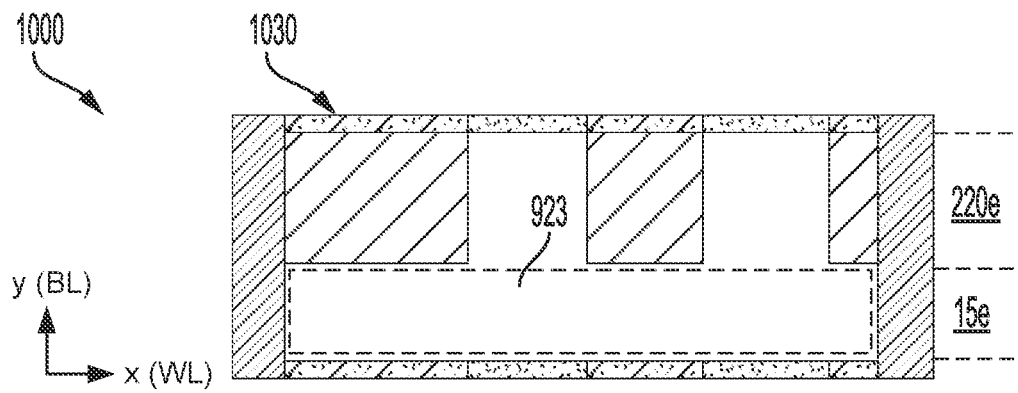
Figure 22:
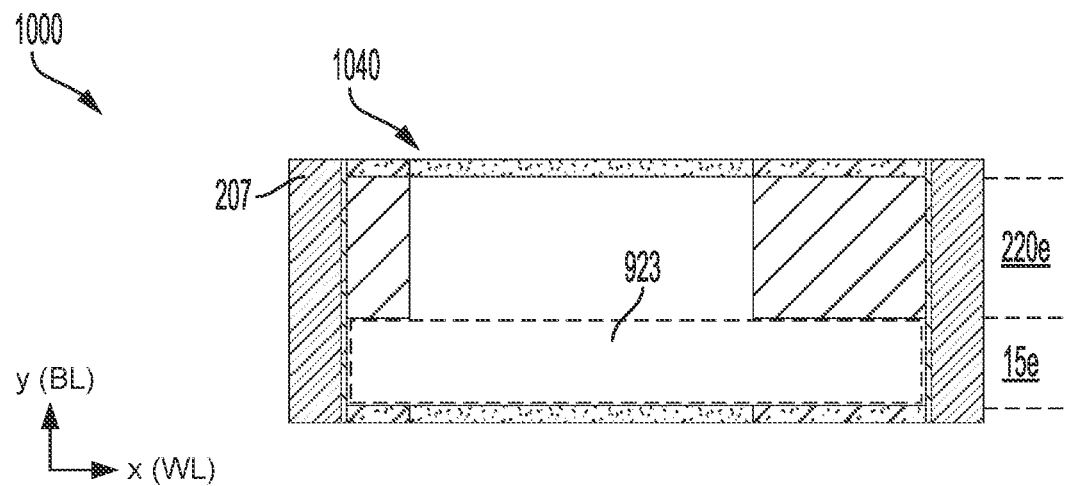
Figure 23:
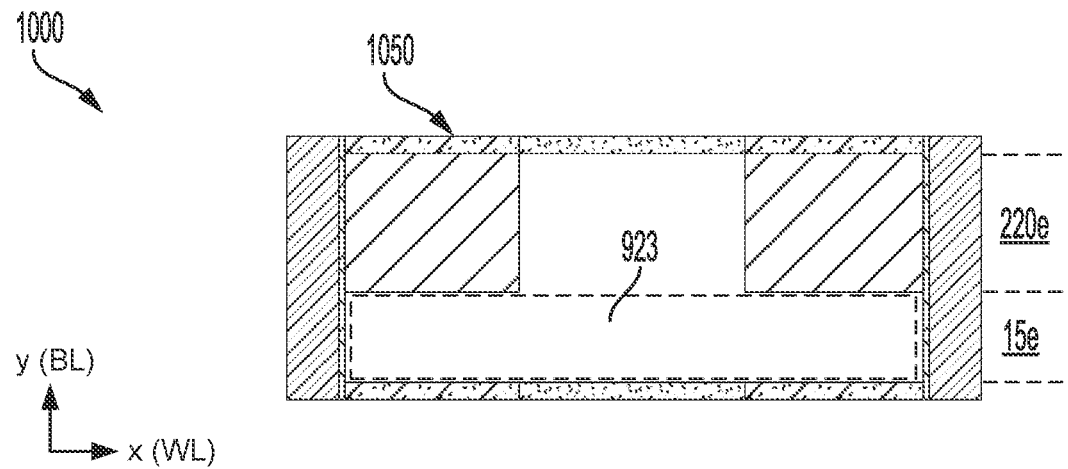

TSC regions can be formed adjacent to and in parallel with a staircase region, as described with reference to FIGS. 4 and 19-23. Referring to FIG. 19, masking layer 1000 includes openings corresponding to staircase regions and TSC regions. Specifically, masking layer 1000 includes staircase pattern 1010 having pattern 901 for covering first and second memory arrays 210*e* and 211*e*. TSC region 15*e* can extend laterally in the word line direction (e.g., x direction) and in parallel with the staircase region in which staircase region 220*e* are formed. Forming TSC regions in parallel with staircase regions can provide the benefits of, among other things, improved device density, reduced fabrication cost, among other things. Trim masks 1020-1050 can be substantially similar to trim masks 620-650 and similar structures can be labelled with similar reference characters. Each of trim masks 1020-1050 includes at least a region 923 in substantially the same region for forming TSC region 15*e*, such that each trim-etch process removes a portion of the underlying alternating dielectric material in TSC region 15*e* until a top surface of the underlying substrate is exposed.

Figure 18:
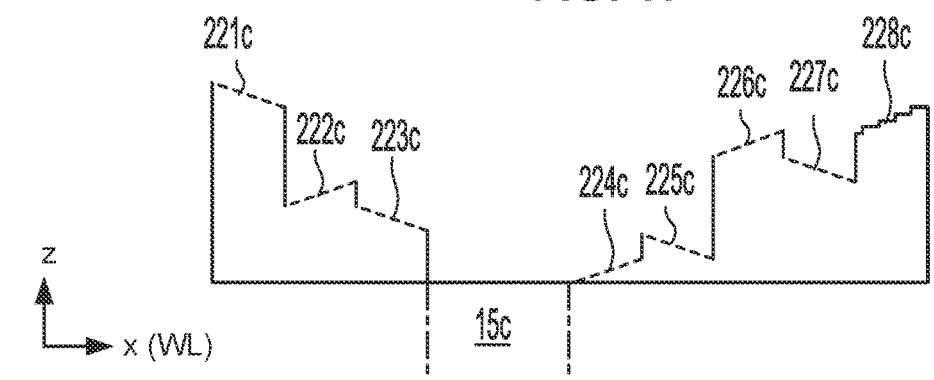

Referring to FIG. 8, at operation S103 of operation S100, a top surface of the underlying substrate can be exposed, according to some embodiments. As illustrated in FIG. 18, the fourth trim-etch process using trim mask 650 illustrated in FIG. 13 continues until material above TSC region 15*c* is completely removed. In some embodiments, a top surface of substrate 102 (not illustrated in FIG. 18 but illustrated in FIG. 1D) can be exposed. The exposure of underlying substrate can be completed by a trim-etch process such as fourth trim-etch process described above, or by a suitable separate etching process.

Referring to FIG. 8, at operation S104 of operation S100, TSCs can be formed in TSC regions, according to some embodiments. An example of TSCs and TSC regions can be TSCs 300 and TSC regions 15c illustrated in FIG. 1D, and are not described herein for simplicity. TSCs can be formed by, for example, etching openings through an isolation dielectric layer and disposing one or more conductive material in the openings.

Referring to FIG. 8, at operation S105 of operation S100, memory strings can be formed, according to some embodiments. Memory strings can extend through an alternating stack of layers and each memory string can include a stack of memory cells. Examples of memory strings can be array of channel structure 212 formed in core array region 211 illustrated in FIG. 1C and are not described herein for simplicity.

Referring to FIG. 8, at operation S106 of operation S100, control gates can be formed, according to some embodiments. In some embodiments, control gates can be formed by removing dielectric layers of the stack of alternating dielectric layers and disposing a conductive material in place of the removed dielectric layers. Examples of control gates can be control gates 333 described in FIG. 1C and are not described herein for simplicity.

Referring to FIG. 8, at operation S107 of operation S100, interconnection layers can be formed, according to some embodiments. Interconnection layers can include conductive pads and lines that provide electrical connections between different structures of the 3D memory device. Examples of interconnect layers can be array of interconnect layers 400 illustrated in FIG. 1D and are not described herein for simplicity.

Referring to FIG. 8, at operation S108 of operation S100, a first bonding layer can be formed, according to some embodiments. The first bonding layer can be formed on a top surface of the isolation dielectric material that encapsulates staircase structures, TSCs, memory arrays, etc. Examples of first bonding layer can be first bonding layer 500 described in FIG. 1C and are not described herein for simplicity.

Referring to FIG. 8, operation S200 includes operations for forming a peripheral chip, among other things. At operation S201 of operation S200, a peripheral circuitry is formed, according to some embodiments. The peripheral circuitry can include any suitable semiconductor devices for operating memory devices, for example, low-voltage or high-voltage devices, metal oxide semiconductor field effect transistors (MOSFETs), bipolar junction transistors (BJTs), diodes, resistors, capacitors, inductors, etc. Examples of peripheral circuitry can be peripheral circuit 800 described in FIG. 1D and are not described herein for simplicity. At operation S202 of operation S200, a second bonding layer is formed, according to some embodiments. The second bonding layer can be formed using a dielectric material suitable for wafer bonding. In some embodiments, conductive structures (e.g., metal bonding pads) can be formed in the second bonding layer. Examples of the second bonding layer can be second bonding layer 700 described in FIG. 1D and are not described herein for simplicity.

Referring to FIG. 8, at operation S300, the first and second bonding layers are bonded through suitable wafer bonding technologies, according to some embodiments. The first and second bonding layers can be attached to each other using hybrid bonding technology, during which dielectric layers and conductive structures from the memory chip and peripheral chip are respectively brought to contact and bonded to each other in a face-to-face manner. In some embodiments, conductive structures such as metal bonding pads from respective chips are aligned and bonded to enable electrical connectivity. Examples of bonded first and second bonding layers can be first and second bonding layers 500 and 700 illustrated in FIG. 1D and are not described in detail herein for simplicity.

Various embodiments in accordance with the present disclosure provide structures and fabricating methods for contact structures in various regions of a 3D memory structure. For example, through silicon contacts can be formed in a region that extends in parallel with a staircase structure or in a region between two opposing staircase structures. Contact structures can be formed in a contact region by removing a portion of an alternating stack of dielectric layers, disposing an isolation dielectric layer in place of the removed portion of the alternating staircase structures, forming openings through the isolation dielectric layer, and disposing conductive material in the openings. In some embodiments, the staircase structures can be formed during a multi-step trim-etch process, referred to as a "multi-chopping" process. The contact structures and methods for forming the contact structures described in the present disclosure provide various benefits, including but not limited to, improved device density, reduce fabrication cost, among other things.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   first and second memory arrays disposed on a semiconductor layer;
   a staircase structure disposed between the first and second memory arrays, wherein:
   the staircase structure includes first and second staircase regions;

the first staircase region includes a first staircase structure, wherein the first staircase structure includes a first plurality of stairs descending in a first direction; and the second staircase region includes a second staircase structure, wherein the second staircase structure includes a second plurality of stairs descending in a second direction; and a contact region disposed between the first staircase region and the second staircase region, wherein the contact region includes a through silicon contact (TSC) structure extending through an insulating layer and into the semiconductor layer, wherein the TSC structure contacts a contact pad at a first end and contacts an interconnection layer at a second end, the first end opposite the second end.

2. The 3D memory device of claim 1, wherein the first and second directions are the same.

3. The 3D memory device of claim 1, wherein the first and second directions are different directions.

4. The 3D memory device of claim 1, wherein the TSC structure contacts a contact structure of the interconnect layer.

5. The 3D memory device of claim 1, wherein the first staircase region further includes a third staircase structure including a third plurality of stairs descending in the second direction that is opposite to the first direction.

6. The 3D memory device of claim 5, wherein a top-most stair of the first plurality of stairs is below a bottom-most stair of the third plurality of stairs.

7. The 3D memory device of claim 5, wherein the first staircase region further includes a fourth staircase structure including a fourth plurality of stairs descending in the first direction, and wherein the third staircase structure abuts the first and fourth staircase structures.

8. The 3D memory device of claim 1, wherein the contact region is between the first staircase region and the second staircase region.

9. The 3D memory device of claim 1, further including a connector structure between the first and second memory arrays in the first direction or the second direction, wherein an extension direction of the connector structure is in the first direction or the second direction.

10. The 3D memory device of claim 9, wherein the connector structure connects the first and second memory arrays.

11. The 3D memory device of claim 9, wherein the connector structure includes pairs of control gates and dielectric layers alternatingly.

12. The 3D memory device of claim 9, wherein at least one stair of the first plurality of stairs is electrically coupled to the first memory array or the second memory array through the connector structure.

13. The 3D memory device of claim 1, further including:
a bonding layer above the TSC structure and the staircase structure; and
a semiconductor structure in contact with the bonding layer, wherein the semiconductor structure includes a peripheral chip.

14. A three-dimensional (3D) memory device, comprising:
a first semiconductor structure, including:
first and second memory array structures disposed on a semiconductor layer;
a staircase structure disposed between the first and second memory array structures and including first and second staircase structures, wherein:
the first staircase structure includes a first plurality of stairs descending in a first direction; and
the second staircase structure includes a second plurality of stairs descending in a second direction;
a contact region between with the first and second staircase structures, wherein the contact region includes a through silicon contact (TSC) structure extending through an insulating layer and into the semiconductor layer, wherein the TSC structure contacts a contact pad at a first end and contacts an interconnection layer at a second end, the first end opposite the second end; and
a first bonding layer over the TSC structure; and
a second semiconductor structure, including:
a peripheral circuit; and
a second bonding layer over the peripheral circuit, wherein the second bonding layer is in contact with the first bonding layer.

15. The 3D memory device of claim 14, wherein the first and second directions are the same.

16. The 3D memory device of claim 14, wherein the first and second directions are different directions.

17. The 3D memory device of claim 14, further including a third staircase structure abutting the second staircase structure, wherein the third staircase structure includes a third plurality of stairs descending in the first direction.

18. The 3D memory device of claim 17, wherein:
the first and second staircase structures abut each other;
the contact region is in contact with the third staircase structure; and
the first and second directions are opposite to each other.

19. The 3D memory device of claim 14, further including a connector structure between the first and second memory array structures, wherein at least one stair of the first plurality of stairs is electrically coupled to the first memory array structure or the second memory array structure through the connector structure.

20. The 3D memory device of claim 19, wherein the connector structure includes pairs of control gates and dielectric layers alternatingly.

* * * * *